United States Patent [19]

Draxelmayr

[11] Patent Number: 4,852,130
[45] Date of Patent: Jul. 25, 1989

[54] SUCCESSIVE APPROXIMATION REGISTER

[75] Inventor: Dieter Draxelmayr, Villach, Austria

[73] Assignee: Siemens Aktiengesellschaft, Berlin and Munich, Fed. Rep. of Germany

[21] Appl. No.: 91,538

[22] Filed: Aug. 31, 1987

[30] Foreign Application Priority Data

Sep. 2, 1986 [DE] Fed. Rep. of Germany ....... 3629832

[51] Int. Cl.$^4$ .......................... G11C 7/00; H03M 1/38
[52] U.S. Cl. ......................................... 377/81; 377/26; 377/54; 341/155
[58] Field of Search ............ 377/26, 81; 340/347 AD, 340/347 M

[56] References Cited

U.S. PATENT DOCUMENTS

| | | | |
|---|---|---|---|
| 3,510,576 | 5/1970 | Centanni | 377/81 |
| 4,336,526 | 6/1982 | Weir | 340/347 AD |
| 4,396,829 | 8/1983 | Sugihara et al. | 377/81 |
| 4,649,371 | 3/1987 | Kolluri | 340/347 AD |

OTHER PUBLICATIONS

"Halbleiter Schaltungstechnik" by Tietze and Schenk 7th Revised Ed. Springer Verlag 1985 pp. 767–771.

IEEE Proceedings E Computers & Digital Techniques vol. 128, No. 2 Part E Mar. 1981, pp. 79–83.
Conference Record, 11th Asilomar Conf. Nov. 7–9, 1977 Pacific Grove, Calif., pp. 45–49, Russel et al.
Computer Design, vol. 11, No. 7, Jul. 1972, pp. 81–86, T. O. Anderson.

Primary Examiner—John S. Heyman
Attorney, Agent, or Firm—Herbert L. Lerner; Laurence A. Greenberg

[57] ABSTRACT

A successive approximation register for an analog/digital converter operating according to the weighing method and having a bit width n includes a comparator and n memory elements each having one data input and one data output for shifting onward a logical "1" potential for each successive weighing step as well as for writing-in and storing in memory the particular result of weighing ascertained by the comparator. Multiplexers are associated with the n memory elements and have data input sides partially connected to the comparator. Logic elements are connected between the data outputs of the memory elements and the multiplexers for respectively controlling the data input sides of the multiplexers.

10 Claims, 1 Drawing Sheet

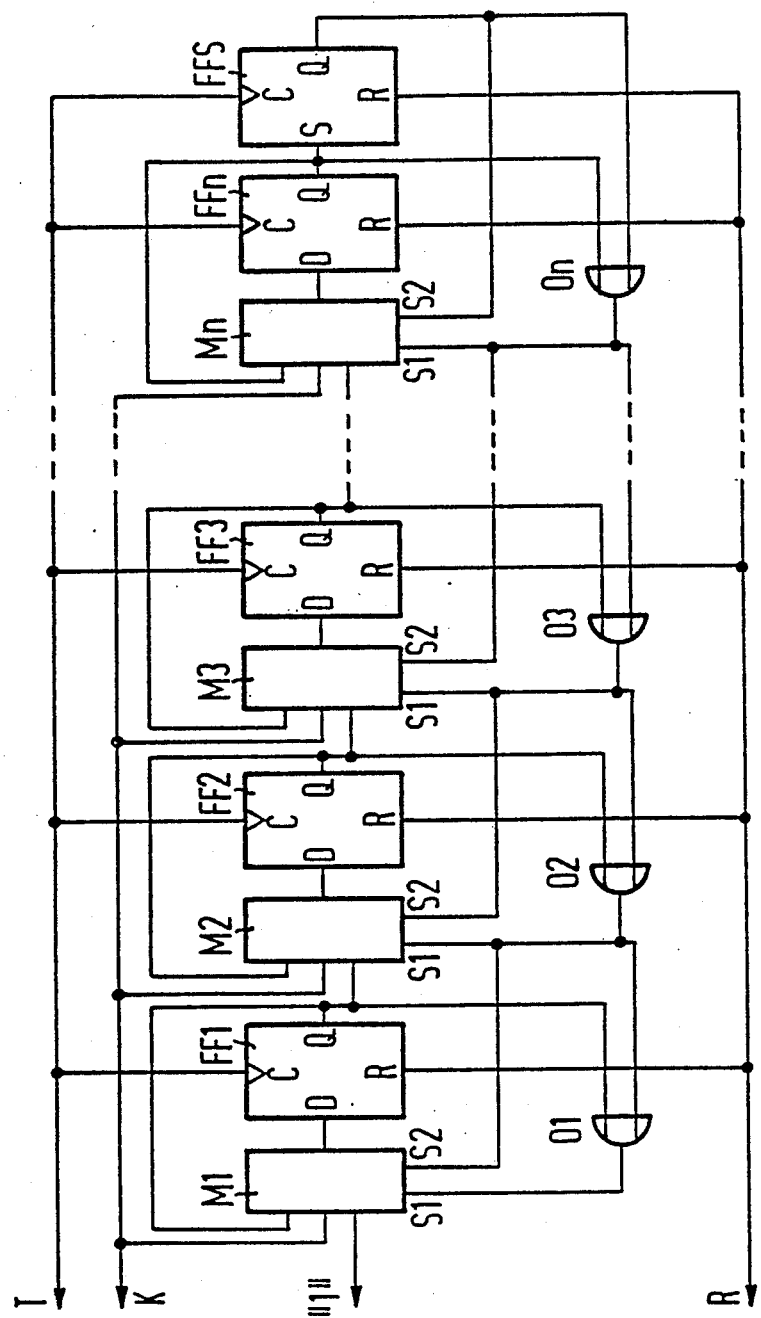

SUCCESSIVE APPROXIMATION REGISTER

BACKGROUND OF THE INVENTION

Field of the Invention

The invention relates to a successive approximation register for an analog/digital converter operating according to the weighing method (digit at a time) and having a bit width n, including memory elements each having one data input and one data output for shifting onward a logical "1" potential for each successive weighing step as well as for writing-in and storing in memory the particular result of weighing ascertained by a comparator.

Registers of this kind are used primarily in analog/digital converters operating according to the weighing method. In this conversion method, the digit places in the register are set successively to a logical "1" potential, beginning with the most significant bit and they are monitored as to whether or not the input voltage is higher than the voltage that corresponds to the digital word of the successive approximation register. If that is the case, then it remains set, but otherwise it is erased. This weighing process is repeated for each bit until the least significant bit is also defined at the end of the conversion phase.

The analog/digital conversion is controlled through the successive approximation register. An analog/digital converter of this kind is described, for instance, in the book entitled "Halbleiter-Schaltungstechnik" [Semiconductor Circuit Technology] by U. Tietze and Ch. Schenk, 7th revised edition, Springer-Verlag, Berlin, Heidelberg, New York, 1985, page 767, in particular pages 769 et seq.

The successive approximation register includes a shift register, in which the a logical "1" potential is incremented by one position at each clock pulse. As a result, the bits are set empirically, in order, to the logical "1" potential. The result of a particular weighing process is also stored in memory elements, into which the applicable comparator state is read. Only the memory element having the associated bit which has just been tested, is made available in this process. Accordingly, for the conversion phase, twice as many memory elements are required as there are bits.

Once the least significant bit has been defined, a further memory element of the shift register is typically set, in order to indicate that the conversion phase has been completed.

It is accordingly an object of the invention to provide a successive approximation register, which overcomes the hereinafore-mentioned disadvantages of the heretofore-known devices of this general type, which performs its function with the lowest possible number of memory elements and which in particular can be implemented in simple fashion for integrated MOS technology.

SUMMARY OF THE INVENTION

With the foregoing and other objects in view there is provided, in accordance with the invention, a successive approximation register for an analog/digital converter operating according to the weighing method and having a bit width n, and a comparator, comprising n memory elements each having one data input and one data output for shifting onward a logical "1" potential for each successive weighing step as well as for writing-in and storing in memory the particular result of weighing ascertained by the comparator, multiplexers being associated with the n memory elements and having data input sides partially connected to the comparator, and logic elements connected between the data outputs of the memory elements and the multiplexers for respectively controlling the data input sides of the multiplexers.

The register according to the invention has the advantages of requiring only as many memory elements as there are bit places and of permitting integrated MOS multiplexers to be very simply assembled from transfer gates.

In accordance with another feature of the invention, the memory elements are clock-controlled and are connected in series with the respective multiplexers in accordance with a dually assigned weighting.

In accordance with a further feature of the invention, the multiplexers each have one shift input for shifting data, one writing input for writing-in data and one memory input for storing data in memory, and the multiplexers each include means for switching-through the shift, writing and memory inputs to the data input of the memory element associated therewith.

In accordance with an added feature of the invention, the multiplexers include a multiplexer assigned a highest weighting and other multiplexers assigned to successively lower weightings, the shift input of the multiplexer assigned the highest weighting is at logical "1" potential, the shift inputs of each respective one of the other multiplexers are connected to the data output of the memory element associated with the other multiplexer assigned to the next higher weighting, the writing inputs of the multiplexers are connected in common to the comparator, and the memory inputs of the multiplexers are connected to the data output of the respective memory element associated therewith.

In accordance with an additional feature of the invention, the other multiplexers include a multiplexer assigned a lowest weighting, the logic elements for controlling the multiplexers from the data outputs of the memory elements successively switch-through the logic "1" potential at the shift input of the multiplexer assigned to the highest weighting to the memory elements and the multiplexers assigned to a lower weighting, the shift inputs of the other multiplexers assigned to a lower weighting in comparison with the memory element assigned to the lowest weighting at a given time and having a logical "1" potential at the data output, being switched-through, the writing input of the multiplexer associated with the memory element assigned to the lowest weighting at a given time having a logical "1" potential at the data output, being switched-through, and the memory inputs of the multiplexers assigned to a higher weighting in comparison with the memory element assigned to the lowest weighting and at a given time have a logical "1" potential at the data output, being switched-through.

In accordance with yet another feature of the invention, the logic elements are OR elements corresponding in number at least to the number of the memory elements.

In accordance with yet a further feature of the invention, the multiplexer assigned to the lowest weighting has one control input and the OR element associated with the multiplexer assigned to the lowest weighting has one input, both being at logical "0" potential.

In accordance with yet an added feature of the invention, there is provided a another memory element connected downstream of the output side of the memory element associated with the multiplexer assigned to the lowest weighting, the other memory element controlling one control input of the multiplexer assigned to the lowest weighting and one input of the OR element associated with the memory element associated with the multiplexer assigned to the lowest weighting. In accordance with yet an additional feature of the invention, each of the logic elements is an OR element associated with a respective one of the memory elements having a multiplexer, each of the OR elements having an output controlling a control input of the respective multiplexer associated therewith and one input of the multiplexer assigned to the next-higher weighting, and each of the OR elements having inputs connected to the data output of the respective memory element associated therewith and connected to the output of the OR element associated with the memory element assigned the next-lower weighting.

In accordance with a concomitant feature of the invention, the logic elements for controlling the multiplexers are carry-look-ahead circuits.

Other features which are considered as characteristic for the invention are set forth in the appended claims.

Although the invention is illustrated and described herein as embodied a in successive approximation register, it is nevertheless not intended to be limited to the details shown, since various modifications and structural changes may be made therein without departing from the spirit of the invention and within the sope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a schematic and block circuit diagram of the successive approximation register according to the invention.

DESCRIPTION OF THE PREFERRED EMBODIMENTS

Referring now to the single FIGURE of the drawing in detail, it is seen that the successive approximation register according to the invention has n flip-flops FF1–FFn serving as memory elements, which represent a dual weighting in accordance with the n bits of the word to be converted. The flip-flops FF1–FFn are in the form of D flip-flops, in which one digital datum present at a data input D is transferred to a data output Q upon each clock pulse. All of the flip-flops FF1–FFn are clock-controlled through a respective input C and can be reset through a respective input R.

The data input side of each flip-flop FF1–FFn is associated with a multiplexer M1–Mn each having two control inputs S1 and S2 and each having three data inputs. The data inputs of the multiplexer can be switched-through selectively to the output or input of the next flip-flop in succession, as a function of the logical potentials at the control inputs. As shown in the drawing, the lower data inputs of the multiplexers each serve as a shift input for the shifting of data, while the middle data input serves as a writing input for writing-in data, and the upper data input serves as a memory input for the storage of data in memory.

The shift input of the multiplexer M1 is at logical "1" potential, while the shift inputs of the other multiplexers are connected to the data output of the particular flip-flop preceding them and corresponding to a higher dual weighting. All of the writing inputs of the multiplexers are connected in common to the output of a comparator K, which is used in the analog/digital converter. The memory inputs of the various multiplexers are connected to the data outputs Q of the various flip-flops associated with them, so that when the memory input is switched-through, the logical potential at the data output of the particular flip-flop is returned to the data input of the flip-flop.

In the embodiment illustrated in the drawing, the multiplexers are controlled with the aid of logical OR elements O1–On and precisely one OR element is associated with each flip-flop having a multiplexer. The output of each OR element controls the control input S1 of the associated multiplexer and the control input S2 of the multiplexer assigned the next-higher weighting. For instance, the output of the logic element O2 controls the control input S2 of the multiplexer M1 and the control input S1 of the multiplexer M2. Correspondingly, since a flip-flop having a higher value is not present, the output of the logic element O1 is connected only to the control input S1 of the multiplexer M1. The inputs of the logical OR elements O1–On are each connected to the data output Q of the associated flip-flop and to the output of the OR element that is associated with the flip-flop having the next-lower weighting. Thus, one input of the element O1 is connected to the data output Q of the flip-flop FF1 and the other input of the element O1 is connected to the output of the element O2.

The control input S2 of the multiplexer Mn and the input of the OR element On which is not connected to the data output Q of the flip-flop FFn are at the same potential, which may either be a logical "0" potential or the "1" potential, which is controlled by the output of a status flip-flop FFS connected to the output side of the approximation register. As shown in the drawing, the status flip-flop FFS is connected on the input side to the output Q of the flip-flop FFn for the least significant bit. As in the illustrated embodiment, the flip-flop FFS may be in the form of an RS flip-flop which does not change its output state if the setting input S resumes a "0" potential after a logical "1" potential.

In order to describe the mode of operation of the successive approximation register, it is assumed that all of the flip-flops are reset at the beginning of the conversion phase. This means that all of the outputs Q are at logical "0" potential and that all of the multiplexers have switched-through the shift input in accordance with the logical "00" position of the control inputs S1 and S2. Thus, the logical "1" potential at the shift input of the multiplexer M1 is shifted onward with each clock pulse by one place or one flip-flop. The flip-flop in which the shifted-through logical "1" potential is located, switches the control input S1 of the associated multiplexer through the associated logical OR element to "1" potential, so that the writing input is switched through to the data input of the flip-flop and the result of the comparator K is taken over upon the next clock pulse. At the same time, the control inputs S1 and S2 of the multiplexers, which are associated with flip-flops having higher dual values, are both at logical "1" potential, so that the memory input of the multiplexer is switched through to the data input of the associated flip-flop and the flip-flop thus stores its value in memory, which corresponds to the result of weighing on the part of the analog-digital converter, until the conclusion of the conversion phase, and optionally longer.

It is generally true that the logical OR elements are connected to logical "1" potential at the output side wherever the shifted-through logical "1" potential of the multiplexer M1 is located or has just been located. The outputs of the other OR elements are at logical "0" potential.

On the assumption that the status flip-flop FFS is not provided, the clock pulse of the successive approximation register according to the invention must be shut off whenever the least significant flip-flop FFn has taken over the comparator result. On the other hand, the status flip-flop FFS is set by the shifted-through logical "1" potential and thus connects the control input S2 of the multiplexer Mn and the output of the logic element On to logical "1" potential, independently of the result of the weighing of the least significant flip-flop FFn, so that this least significant flip-flop FFn is also connected on the input side to the memory input of the multiplexer Mn.

It is within the scope of the invention for the logic elements provided for controlling the multiplexers to also be more complexly constructed, if higher demands for the processing speed are to be made. In such a case, OR elements having more than two inputs can also be used. For example, in the least favorable case it is possible that a signal may have only a maximum of two elements to pass through in succession, instead of all of the OR elements as in the illustrated embodiment. However, for this kind of carry-look-ahead circuit, more logic elements than in the illustrated embodiment are typically needed.

The successive approximation register according to the invention can therefore perform the tasks set for it, namely implementation of a flow control for determining the conversion step just being performed at that time, processing of the result furnished by the analog portion or comparator and storage in memory of the result of weighing for the rest of the conversion, with a number of memory elements that corresponds to the number of bits, using multiplexers that are very simply produced by integrated MOS technology and with only a very few components.

I claim:

1. Sucessive approximation register for a data word of n bits, comprising respective n stages, the first stage having an input for a logical "1" potential, and a signal input; each stage having a memory element with a respective data input and data output; steering means including shift inputs for successively shifting the "1" potential onward and for writing a signal bit into the respective memory elements; a multiplexer for each stage; a writing input common to all stages connected to the signal input; all multiplexer except the first one, having a shift input connected with the preceding stage; a memory input connected with the data output of the same stage; and logic elements for switchably connecting the data output of each memory element with a control input of the multiplexer of the same stage.

2. Register according to claim 1, wherein said memory elements are clock-controlled and are connected in series with said respective multiplexers and each stage can be given a weighting equal to the corresponding bit of the data word.

3. Register according to claim 1, wherein said multiplexers include a multiplexer assigned a highest weighting and other multiplexers assigned to successively lower weighting, said shift input of said multiplexer assigned the highest weighting is at logical "1" potential, said shift inputs of each respective one of said other multiplexers are connected to said data output of said memory element associated with said other multiplexer assigned to the next higher weighting.

4. Register according to claim 3, wherein said other multiplexers include a multiplexer assigned a lowest weighting, said logic elements for controlling said multiplexers from said data outputs of said memory elements successively switch-through the logic "1" potential at said shift input of said multiplexer assigned to the highest weighting to said memory elements and said multiplexers assigned to a lower weighting, said shift inputs of said other multiplexers assigned to a lower weighting in comparison with said memory element assigned to the lowest weighting at a given time and having a logical "1" potential at the data output, being switched-through, said writing input of said multiplexer associated with said memory element assigned to the lowest weighting at a given time having a logical "1" potential at said data output, being switched-through, and said memory inputs of said multiplexers assigned to a higher weighting in comparison with said memory element assigned to the lowest weighting and at a given time have a logical "1" potential at said data output, being switched-through.

5. Register according to claim 4, wherein said logic elements are OR elements corresponding in number at least to the number of said memory elements.

6. Register according to claim 5, wherein said multiplexer assigned to the lowest weighting has one control input and said OR element associated with said multiplexer assigned to the lowest weighting has one input, both being at logical "0" potential.

7. Register according to claim 5, including another memory element connected downstream of the output side of said memory element associated with said multiplexer assigned to the lowest weighting, said other memory element controlling one control input of said multiplexer assigned to the lowest weighting and one input of said OR element associated with said memory element associated with said multiplexer assigned to the lowest weighting.

8. Register according to claim 4, wherein each of said logic elements is an OR element associated with a respective one of said memory elements having a multiplexer, each of said OR elements having an output controlling a control input of said respective multiplexer associated therewith and one input of said multiplexer assigned to the next-higher weighting, and each of said OR elements having inputs connected to said data output of said respective memory element associated therewith and connected to said output of said OR element associated with said memory element assigned the next-lower weighting.

9. Register according to claim 1, wherein said logic elements for controlling said multiplexers are carry-look-ahead circuits.

10. Register according to claim 1, wherein said logic elements are OR elements.

* * * * *